United States Patent

[11] 3,615,933

[72] Inventor Reinhard Dahlberg
Freiburg, Germany
[21] Appl. No. 840,888
[22] Filed May 22, 1969
[23] Division of Ser. No. 498,158, Oct. 19, 1965, abandoned, which is a continuation-in-part of Ser. No. 4,541, Jan. 25, 1960, abandoned
[45] Patented Oct. 26, 1971
[73] Assignee Siemens Aktiengesellschaft
Berlin and Munich, Germany

[54] METHOD OF PRODUCING A GERMANIUM TRANSISTOR
5 Claims, 6 Drawing Figs.

[52] U.S. Cl. .................................................... 148/177,
148/180, 148/184, 148/185
[51] Int. Cl. .................................................... H01l 7/46
[50] Field of Search .................................................... 148/177,
178, 179, 180, 181, 182, 184, 185, 1.5, 33

[56] References Cited
UNITED STATES PATENTS

| | | | |
|---|---|---|---|
| 2,730,663 | 1/1956 | Harty .......................... | 148/33 |
| 2,834,701 | 5/1958 | Gudmundsen et al. ....... | 148/185 |
| 2,963,390 | 12/1960 | Dickson ...................... | 148/1.5 |

*Primary Examiner*—Richard O. Dean
*Attorney*—Hill, Sherman, Meroni, Gross & Simpson

ABSTRACT: The method of making transistors in which germanium and tantalum discs are joined by an adhesion metal such as aluminum such that the joined surfaces form an electrical contact and forms the collector. The emitter is formed on the second side of the germanium disc by alloying a pill of metal into the disc and the base is formed on the remaining portion of the second side. The adhesion metal dopes the germanium during the joining process.

Figure 1:
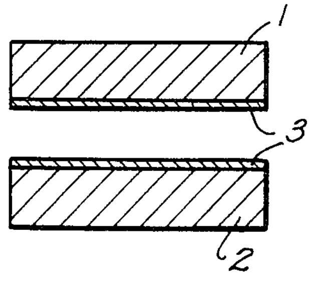

INVENTOR
Reinhard Dahlberg
Spiegel & Spiegel

METHOD OF PRODUCING A GERMANIUM TRANSISTOR

This is a division of application, Ser. No. 498,158, filed Oct. 19, 1965, now abandoned which was in turn a continuation-in-part of application, Ser. No. 4,541, filed Jan. 25, 1960, now abandoned.

This invention is concerned with a semiconductor device and a method of producing and contacting it.

Figure 3:
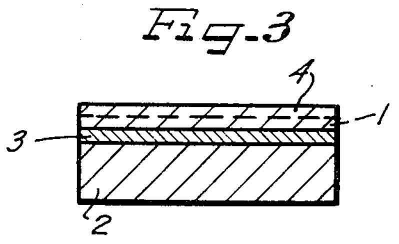
Figure 4:
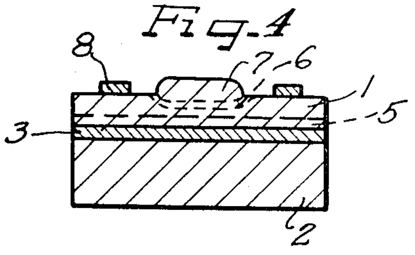
Figure 5:
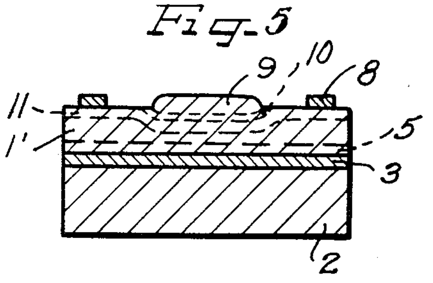
Figure 6:
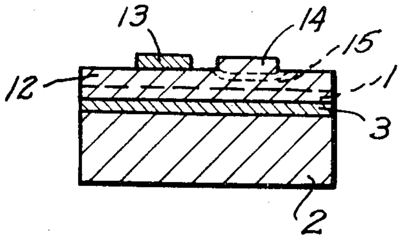

The method according to the invention comprises fastening a disk-shaped semiconductor body upon a metallic carrier, with the aid of an adhesion metal adapted to adhere to the carrier and to alloy with the semiconductor, and thereafter working the semiconductor body chemically and/or mechanically to the desired thickness. The adhesion metal employed for fastening the semiconductor body is a metal from the third or fifth group of the periodic system of elements, which is effected as a doping metal. The semiconductor body is by the alloying-in of the adhesion metal either overdoped so as to produce a contact which is free of a PN junction or its doping is changed so as to provide a PN junction A doping metal is moreover diffused into the thin semiconductor body upon the side thereof which faces away from the carrier, so as to produce the PN junction The various objects and features of the invention will appear from the description of embodiments which is rendered below with reference to the accompanying drawing. In the drawing, FIGS. 1 and 2 illustrate steps in producing a semiconductor device as shown in FIG. 2;

FIGS. 3 and 4 show respectively a rectifier and a transistor made in accordance with the invention; and FIGS. 5 and 6 show further embodiments of the invention.

Figure 2:
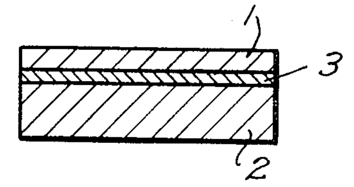

In FIG. 1, numeral 1 indicates a disk-shaped waferlike semiconductor body made for example of germanium, and numeral 2 indicates a carrier, made for example of tantalum.

Any suitable metal may be employed for the carrier, in which only two primary requisites are involved, the first that it provides suitable supporting characteristics for the semiconductor, and the second that its chemical characteristics will not conflict with the intended use. Thus, with respect to the first point, it should be capable of connection to the semiconductor (by means of a solder having doping properties) should possess adequate mechanical stability, and have a thermal expansion that does not radically differ from that of the semiconductor. With respect to the second point, it must have a sufficiently high-melting point that it will satisfactorily withstand temperatures involved in any heat treatments to which the semiconductor is subjected, and must not produce any undesired contaminations of the semiconductor body.

Thus, for example, with germanium, metals such as tantalum, niobium, vanadium, molybdenum, tungsten and titanium are suitable. Similarly, the suitability of any metal for such purposes, in connection with the use of silicon or other semiconductor material, can be readily determined by a comparison of the above enumerated characteristics of the materials. Likewise, materials which do not exhibit all of the desirable characteristics, may be employed, for example, if mechanical stability is low, the material may be employed as a coating or layer upon another material which supplies the deficiency, with the semiconductor material being secured to such layer.

The surface of the semiconductor wafer 1 and the carrier 2 facing one another and being of equal size, are lapped plane, polished, and covered with adhesion metal 3 adapted to act as a doping metal. The adhesion metal may, for example, be aluminum, which is vaporized on the corresponding surfaces and if desired alloyed thereinto. The semiconductor body 1 and the carrier 2 are thereupon placed together with the surfaces provided with the adhesion metal 3 in engagement, and are alloyed together under pressure and at a temperature lying above the alloying temperature of the adhesion metal with the semiconductor body. In this example, the temperature for the alloying of a germanium body on a tantalum carrier, with aluminum as an adhesion metal, amounted to about 700° C. In this system which is thus alloyed together, the semiconductor wafer 1 can be made very thin by grinding and/or etching, without detrimentally affecting the ease of manipulation or, due to brittleness of the semiconductor material, the stability of the system.

The invention permits to produce in this manner, for example, a semiconductor device such as illustrated in FIG. 2, in which a thin semiconductor disk or wafer 1 is throughout its entire area intimately connected with the carrier body 2. Semiconductor layers about 10 microns thick and with an area of about 1 square centimeter can be obtained with customary grinding and polishing operations or by the use of etching.

FIG. 3 illustrates a rectifier in which the doping on the side of the semiconductor wafer 1 which faces away from the carrier 2 is changed throughout the entire extent of the corresponding surface. The carrier 2 can again consist, for example, of tantalum. The semiconductor body 1 is connected with the carrier 2 by means of the adhesion metal 3 and is worked chemically and/or mechanically to the desired thickness. In order to obtain a contact which is free of a PN junction, the adhesion metal 3 is a kind which produces the same conduction type as the semiconductor wafer 1. If the semiconductor wafer 1 is in this embodiment made of P-conductive germanium, the adhesion metal 3 will be a metal which has P-doping character, particularly a metal of the third group of the periodic system of elements, for example, aluminum. The doping of the portion 4 of the semiconductor wafer 1 on the side thereof which faces away from the carrier 2, is changed by diffusion of a doping metal, thereby producing a PN junction. In the present example, the layer 4 is of the N-conductive type and is produced by diffusion of an N-doping metal, particularly a metal from the fifth group of the periodic system of elements, for example, arsenic.

An alloyed tantalum-germanium-system has been produced, applying the invention and using aluminum as an adhesion metal, and PN junctions have been produced therein by diffusion of arsenic with diffusion depths from 1 to 2 microns, the blocking currents at about 30V blocking voltage amounting to 10 to 20 p.A/per square millimeter.

The method according to the invention is also applicable in the production of transistors. In the embodiment illustrated in FIG. 4, the side of the semiconductor disk or wafer 1 which faces away from the carrier 2 is for the production of the emitter junction oppositely doped only along a portion of the surface lying concentric to the carrier 2 while being contacted free of a PN junction by overdoping to serve as a base along another portion of the corresponding surface. The adhesion metal 3 used in this embodiment was of a kind adapted to oppositely dope the layer 5 of the semiconductor body 1, incident to the alloying with the carrier 2, the oppositely doped layer constituting, for example, the collector layer. The wafer is thereupon mechanically and/or chemically worked to the desired thickness, and the metal pill 7 is alloyed thereinto. Upon cooling, there is formed the recrystallization zone 6 which is doped opposite to the doping of the semiconductor body 1, serving, for example, as emitter. The annular base electrode 8 contacts the semiconductor body free of PN junction.

The invention is particularly well adapted for producing so-called drift transistors with pnip and npin zone sequence.

FIG. 5 shows an embodiment in which an intrinsically conductive semiconductor disk or wafer 1' is in accordance with the invention alloyed together with the carrier 2, forming a P-(orn-) doped layer 5. Upon the side of the semiconductor wafer 1' which faces away from the carrier is by diffusion produced a thin N- (orp-) conducting base zone 11 which is contacted free of PN junction by the annular base electrode 8. The emitter pill 9 is alloyed-in in accordance with the known post-alloy method. The emitter pill contains donator- and acceptor impurities which diffuse into the semiconductor body with different velocities. The impurities are thereby such that the one which produces the same conduction type as the base zone 11 diffuses into the semiconductor body faster, while the other one is highly soluble in the semiconductor body and present in the melt in sufficient concentration, so that such impurity predominates in the recrystallization zone 10 upon cooling of the melt. A transistor is in this manner produced, having pnip (or npin) sequence, which is particularly suitable for high frequencies.

In another embodiment, represented in FIG. 6, the emitter 14 and the base contact 13 are produced, for example, by vaporization or stippling of the doping material, the doping substance being such that the emitter forms a PN junction 15 in the base layer 12, while the base contact material contains substances of a doping type corresponding to that of the base layer 12. The emitter electrode and the base electrode are in this embodiment suitably in the form of parallel disposed strips.

It is understood, of course, that known dual or double diffusion can be combined with the method according to the invention.

A metallic carrier such as indicated by numeral 2 promotes in all embodiments dissipation of heat especially with respect to the electrode connected with such carrier.

Changes and modifications may be made within the scope and spirit of the appended claims which define what is believed to be new and desired to have protected by Letters Patent.

I claim:

1. The method of producing a germanium transistor comprising the steps of,
   a. applying an adhesion metal to a first surface of a disc of germanium,
   b. applying said adhesion metal to a first surface of a disc of tantalum,
   c. pressing the coated first surfaces of said discs of germanium and tantalum together,
   d. heating said discs to a temperature high enough to alloy the adhesion metal to join said discs and to dope said portion of said germanium adjacent said first surface,
   e. removing a part of said germanium disc on the side away from said first surface until the disc is about 10 microns thick,
   f. heating to alloy a metal pill into a first portion of the second surface of said germanium disc to form an emitter for said transistor,
   g. attaching a base electrode to said second surface on a second portion thereof and
   h. said tantalum disc forming a collector electrode of said transistor.

2. The method of claim 1 wherein said adhesion metal dopes said first surface of said germanium, a first conductive type and said metal pill dopes, said first portion a first conductive type.

3. The method of claim 2 wherein said germanium disc is initially a second conductive type.

4. The method of claim 2 wherein said germanium disc is initially intrinsic semiconductor material and a second conductive type is diffused into said second portion between said emitter and collector.

5. The method of claim 2 wherein said adhesion metal is aluminum.

* * * * *